(12) United States Patent
Vedelago et al.

(10) Patent No.: US 11,799,470 B2
(45) Date of Patent: Oct. 24, 2023

(54) MULTI-PURPOSE OUTPUT CIRCUITRY

(71) Applicant: NXP B.V., Eindhoven (NL)

(72) Inventors: Juliette Angèle Vedelago, Toulouse (FR); Pascal Kamel Abouda, Saint Lys (FR); Soufiane Serser, Toulouse (FR)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/816,891

(22) Filed: Aug. 2, 2022

(65) Prior Publication Data
US 2023/0042952 A1  Feb. 9, 2023

(30) Foreign Application Priority Data

Aug. 6, 2021 (EP) .................................... 21306104

(51) Int. Cl.
*H03K 17/00* (2006.01)
*H03K 17/16* (2006.01)
*H03H 7/06* (2006.01)
*H03K 17/687* (2006.01)

(52) U.S. Cl.
CPC ............. *H03K 17/161* (2013.01); *H03H 7/06* (2013.01); *H03K 17/165* (2013.01); *H03K 17/687* (2013.01)

(58) Field of Classification Search
CPC .. H03K 17/161; H03K 17/165; H03K 17/082; H03K 17/16
See application file for complete search history.

(56) References Cited

U.S. PATENT DOCUMENTS

| | | |
|---|---|---|
| 5,324,999 A | 6/1994 | Hunley et al. |
| 5,612,582 A * | 3/1997 | Shichi .............. H03K 17/04206 307/130 |
| 5,877,634 A | 3/1999 | Hunley |
| 6,472,906 B2 | 10/2002 | Sanwo et al. |
| 9,461,640 B2 | 10/2016 | Hiyama |
| 10,938,387 B1 | 3/2021 | Miyamae |
| 2006/0033552 A1 | 2/2006 | Ishikawa et al. |
| 2006/0126253 A1* | 6/2006 | Urakabe ........... H03K 17/6871 361/118 |
| 2009/0256619 A1* | 10/2009 | Hsu ..................... H03K 17/6877 327/379 |
| 2011/0148376 A1* | 6/2011 | Xu ........................ H03K 17/165 327/434 |
| 2013/0315294 A1* | 11/2013 | Ishizeki ......... H03K 19/018521 375/232 |

(Continued)

FOREIGN PATENT DOCUMENTS

KR  10-2006-0005515 A1  1/2006

*Primary Examiner* — Tuan T Lam

(57) ABSTRACT

An integrated circuit can comprise an output terminal, a power transistor having a first current electrode coupled to the output terminal and a second current electrode coupled to a power supply terminal, a driver having an output coupled to a control electrode of the power switch, a capacitor having a first terminal coupled to the output terminal and a second terminal coupled to a circuit node, a first low pass filter coupled between the circuit node and an input of the driver, the first low pass filter having a first cut off frequency, a set of current sources, and a second low pass filter coupled between the circuit node and an output of the set of current sources. The second low pass filter can have a second cut off frequency that is higher than the first cut off frequency.

13 Claims, 4 Drawing Sheets

(56) References Cited

U.S. PATENT DOCUMENTS

2018/0219545 A1\* 8/2018 Bondade ............. H03K 17/168
2021/0259674 A1\* 8/2021 Swift ..................... A61B 17/02
2022/0107909 A1\* 4/2022 Banerjee ............ H03K 17/6871

\* cited by examiner

MULTI-PURPOSE OUTPUT CIRCUITRY

CROSS-REFERENCE TO RELATED APPLICATIONS

This application claims the priority under 35 U.S.C. § 119 of European Patent application no. 21306104.7, filed on Aug. 6, 2021, the contents of which are incorporated by reference herein.

BACKGROUND

Field

This disclosure relates generally to semiconductor devices, and more specifically, to multi-purpose output circuitry with improved electromagnetic immunity.

Related Art

A semiconductor processing device typically includes conductive pads or pins to electrically connect the processing device to components external to the device. The connections allow signals to be communicated electronically between the processor and the external components. The conductive pads/pins are connected to input/output (I/O) circuitry in the processor that provide an interface to components in the processor. Depending on the application, a microcontroller's I/O circuitry may comprise a primary interface to external circuitry or may be just one type of output used among several, such as analog signals, counter/timer, and serial communication. Multi-Purpose I/O (MPIO) circuitry in a semiconductor processing device has no pre-defined purpose and may be assigned for whatever use is needed.

In automotive applications, Multi-Purpose Output (MPO) circuits can be used to communicate signals for purposes such as turning on a warning lamp, driving an actuator, and reading wheel speed, among others. Since the I/O circuitry is coupled to external components, the circuitry may be subject to electrical stresses such as direct power injection. The I/O circuitry may also generate emissions that affect other circuits.

Accordingly, it is desirable to provide MPO circuitry with improved electromagnetic compatibility that is both immune to electrical stress as well as avoids affecting operation of other circuits.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments disclosed herein provide multi-purpose output (MPO) circuitry with features that increase immunity to electrical stress from direct power injection and reduce emissions that may affect other circuitry. To achieve these improvements, filters are used to redirect signals of selected frequencies. A first filter with a high cutoff frequency is added near current sources to prevent an output transistor from being switched ON during direct power injection when the transistor should be switched OFF. A second filter with a lower cutoff frequency is added to remove noise at the input to an output driver. In addition, a stronger pull-down device is implemented in the driver to maintain input and output at a low level to insure the voltage at the control gate of the output transistor is low enough to avoid turning the transistor ON in an OFF state. These and other features and advantages are further described hereinbelow.

Figure 1:
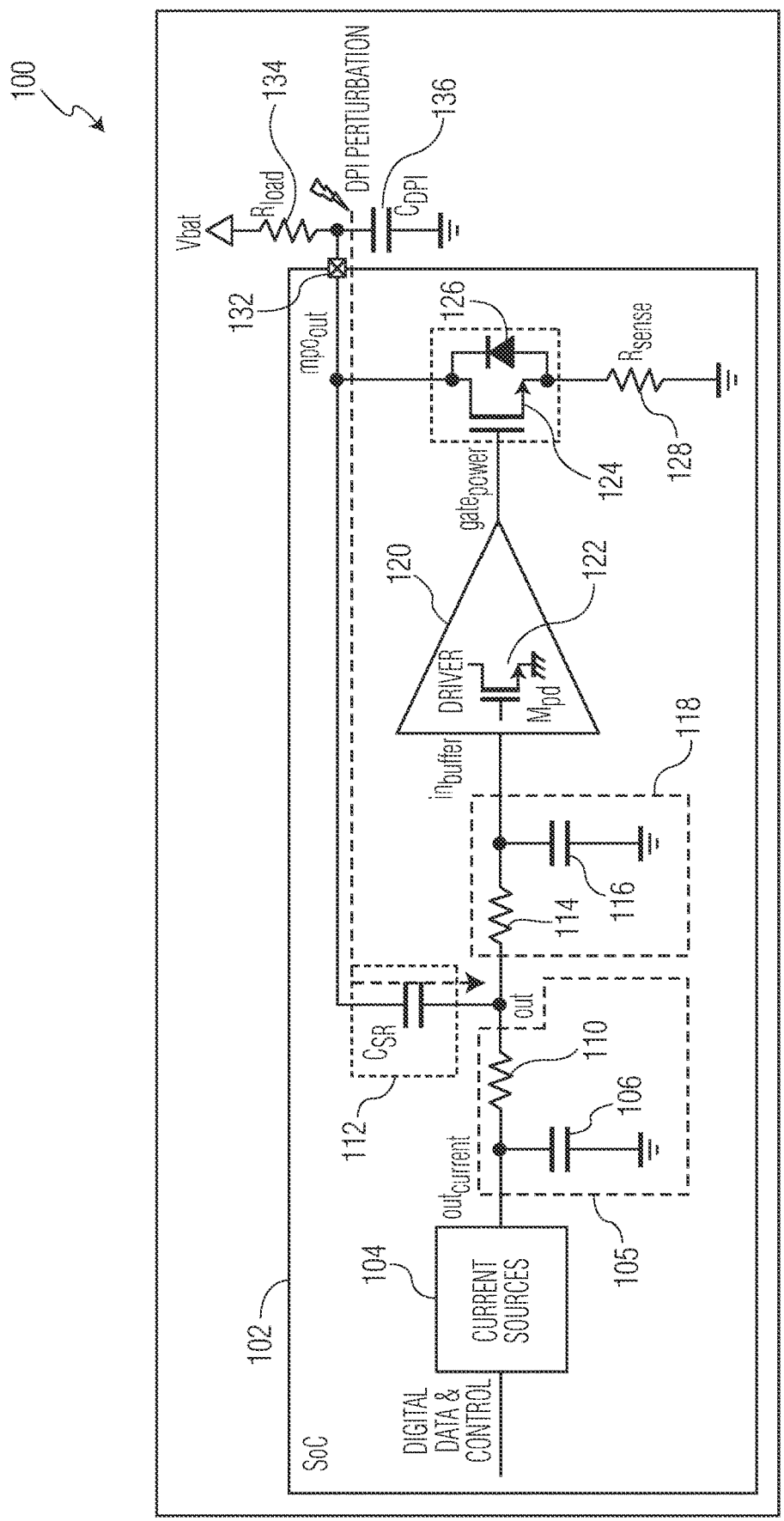
FIG. 1 illustrates a block diagram of integrated circuitry that includes multi-purpose output circuitry in accordance with selected embodiments of the present invention.

FIG. 1 illustrates a block diagram of integrated circuit 100 that includes multi-purpose output (MPO) circuitry in accordance with selected embodiments of the present invention that includes a system on chip with MPO circuitry 102 having output contact 132 coupled to a load represented by resistor 134 at battery voltage VBAT and load capacitor 136. In the embodiment shown, MPO circuitry 102 includes current sources 104, low pass filter 105 with high cutoff frequency, slew rate capacitor 112, low pass filter 118 with medium cutoff frequency, driver buffer 120 with pull-down device 122, output power switch 124, sense resistor 128, and multi-purpose output contact 132. High cutoff frequency low pass filter 105 includes resistor 110 and capacitor 106. Medium cutoff frequency low pass filter 118 includes resistor 114 and capacitor 116. The SoC may also include other components such as one or more processing cores coupled to MPO circuitry, direct memory access controllers, memory devices, interconnects, peripheral and network interfaces, and other suitable components.

Current sources 104 receive digital output data and control signals from a processor core or other suitable component. A first terminal of resistor 110 is coupled to the output of current sources 104, and a second terminal of resistor 110 is coupled to a first terminal of resistor 114 in medium cutoff frequency low pass filter 118 at node OUT. A second terminal of resistor 114 is coupled to the input of driver circuit 120. Capacitor 106 includes a first terminal coupled to the first terminal of resistor 110 and a second terminal coupled to ground. Capacitor 116 includes a first terminal coupled to the second terminal of resistor 114 and a second terminal coupled to ground. Driver circuit 120 includes an input coupled to the output of medium cutoff frequency low pass filter 118 and an output coupled to a control gate of output power switch 124. A first electrode of power switch 124 is coupled to node MPO_OUT and a second electrode of power switch 124 is coupled to a first terminal of resistor 128. A second terminal of resistor 128 is coupled to ground. Slew rate capacitor 112 includes a first terminal coupled to output contact 132 and a second terminal coupled to the connection between high cutoff frequency low pass filter 105 and medium cutoff frequency low pass filter 118. Node MPO_OUT is also coupled to output contact 132.

Current sources 104 can be implemented using a digital to analog converter (DAC) or other suitable device. Digital data and control signals are provided as input to current sources 104, and depending on the type of current sources 104 being used, the control signals can include a clock signal, a synchronization signal, and/or other suitable signals. The digital data can include a number of bits, based on the data word length. Current sources 104 generate an analog current or voltage representative of the digital data. The output from current sources 104 is provided to the input of high cutoff frequency low pass filter 105. The output of high cutoff frequency low pass filter 105 is provided to the input of medium cutoff frequency low pass filter 118. The output of medium cutoff frequency low pass filter 118 is provided to the input of driver circuit 120. The output of driver circuit 120 is provided to a control electrode of power switch 124.

A slew rate control function using capacitor 112 can be used to control emissions of output contact 132 to not disturb external devices. Emission control is done by controlling a current inside capacitor 112 between node OUT and output contact 132. Capacitor 112 can, however, create a new perturbation path for electro-magnetic perturbations between output contact 132 and the input to driver circuit 120 and the output of current sources 104. The perturbation, referred to as direct power injection (DPI), can occur at any time at output contact 132, and can create a dysfunction while output power switch 124 is OFF. While load capacitor 136 can be used to absorb some of the perturbation, capacitor 112 can be used to control slew rate on an external MPO pin, and create a new path for DPI perturbation. In this way, the rectification due to diode effects in power switch 124 can be limited, with the DPI perturbation being conducted through slew rate capacitor 112. Using capacitor 112 does, however, direct the DPI perturbation toward current sources 104 and driver circuit 120, which can cause other problems at certain frequencies. For example, at higher frequencies, a noisy signal from current sources 104 caused by the DPI perturbation can cause power switch 124 to turn ON when power switch 124 is intended to be OFF. In addition, medium frequency perturbation can affect the output of driver circuit 120 and thus the output signal used to control the operation of power switch 124. The problems caused by the DPI perturbation being conducted through capacitor 112 to current sources 104 and driver circuit 120 can be overcome using high cutoff frequency low pass filter 105 and medium cutoff frequency low pass filter 115, however, as further explained herein.

Output driver circuit 120 can be implemented with an operational amplifier or other suitable component. In some implementations, voltage at output contact 132 is expected to be close to 0V when MPO circuitry 102 is ON and at battery voltage (e.g., 14V) when MPO circuitry 102 is OFF. For DPI perturbations at certain low frequencies and amplitude, for example, frequencies between 3-9 MHz and 29 dBm amplitude, MPO circuitry 102 may be unable to remain OFF as the perturbation voltage at the input to driver circuit 120 causes the output of driver circuit 122 to be at a level that causes power switch 124 to turn ON and pull the voltage at node MPO_OUT to ground. To solve this issue, a pull-down device 122 can be implemented at an input stage of driver circuit 122 that is strong enough to help ensure power switch 124 remains OFF when MPO circuitry 102 is supposed to be OFF. Pull-down device 122 can be implemented with an NMOS or N-type channel transistor with a source electrode coupled to ground and a drain electrode coupled to a voltage source and to control operation of power switch 124. Other suitable components can be used to maintain the input and output of driver circuit 120 at a level that prevents power switch 124 from being turned ON when MPO circuitry 102 is supposed to be OFF.

In addition to problems caused by DPI perturbations at low frequencies, DPI perturbations at medium frequencies, for example, 20-100 MHz at an amplitude of 36 dBm, can also cause the input voltage at driver circuit 120 to be higher than desired to provide an output that turns power switch 124 ON when power switch 124 and therefore MPO circuitry 102 are supposed to be OFF. To help solve this problem, medium cutoff frequency low pass filter 118 can be implemented between capacitor 112 to remove medium frequency perturbation at the input to driver circuit 120.

DPI perturbation may also have relatively high frequency components, for example, frequency between 600-800 MHz at an amplitude of 33 dBm. If high cutoff frequency low pass filter 105 is not implemented, the DPI perturbation may be sufficient to increase the voltage at the input of driver circuit 120 to a level that will cause power switch 124 to turn ON unexpectedly. For example, during an OFF phase of MPO circuitry 102, power switch 124 is typically not in a conductive mode. The OUT_CURRENT voltage from current sources 104 can be sufficiently noisy that, when added to the DPI perturbation, power switch 124 will be turned ON instead of OFF. High cutoff frequency low pass filter 105 at the output of current sources 104 can remove high frequency voltage from the output of capacitor 112 at node OUT that can otherwise affect the output of current sources 104. MPO circuitry 102 can thus be prevented from turning ON unintentionally due to high frequency DPI perturbation.

Power switch 124 can be implemented with a MOS transistor or other suitable device. For example, in the embodiment shown, power switch 124 is implemented with an NMOS transistor, however, power switch 124 can be implemented with a PMOS transistor with other components of driver circuit 102 adjusted to take into account the opposite logic.

Figure 2:
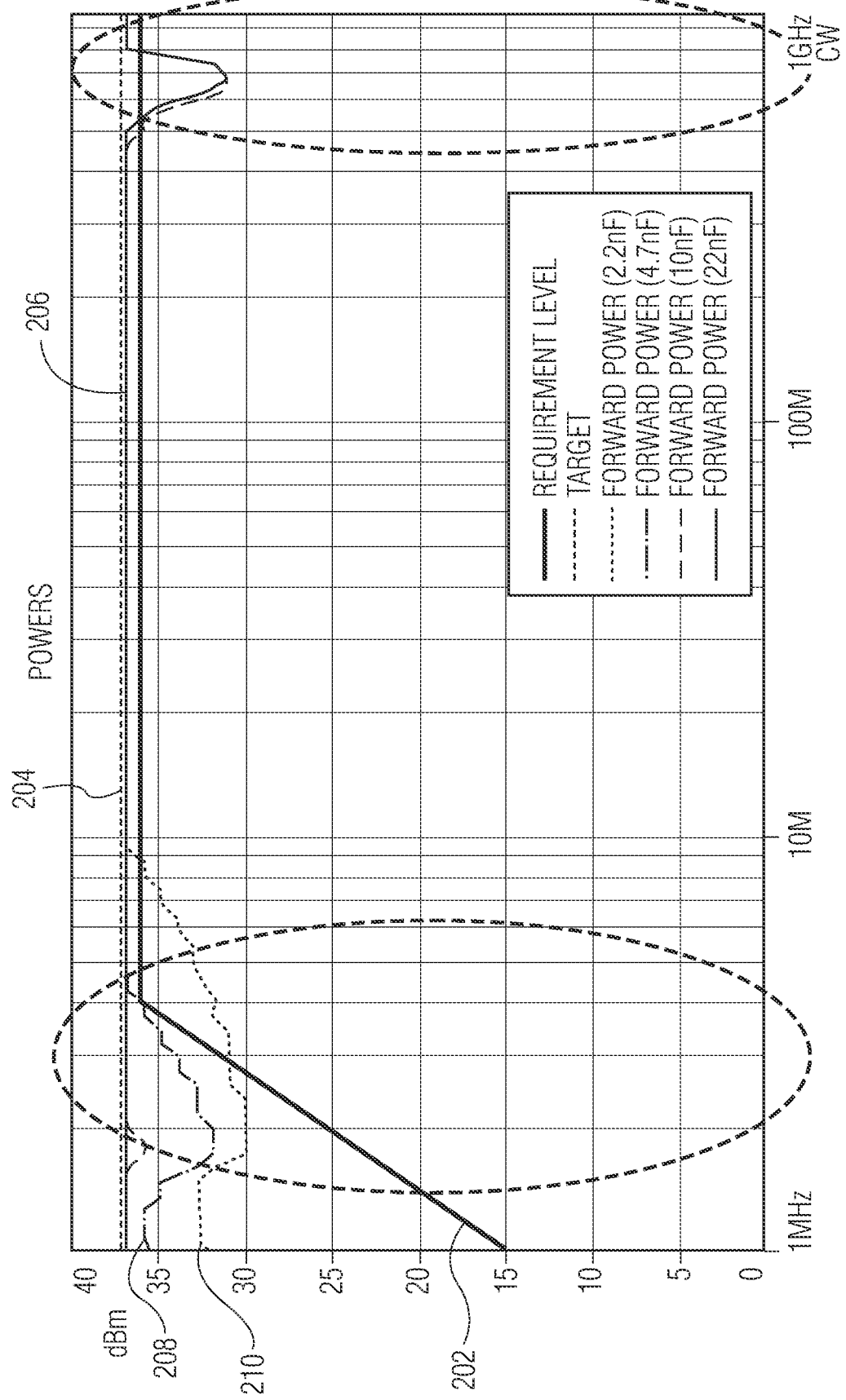
FIG. 2 illustrates a set of curves of an example of performance of multi-purpose output circuitry without design improvements disclosed herein.

Referring to FIGS. 1 and 2, FIG. 2 illustrates a set of curves of an example of performance of multi-purpose output circuitry 102 with DPI perturbation at output pin 132 without design improvements disclosed herein. Curve 202 shows the required level of amplitude versus frequency while curves 202 through 210 show performance of MPO circuitry 102 at different levels of capacitance values for load capacitor 136. The requirement curve 202 begins with a ramp starting at 1 MHz with a 15 dBm amplitude and ending at 3 MHz at an amplitude of 36 dBm. At 3 MHz, requirement curve 202 remains at an amplitude of 36 dBm to a frequency of 1 GHz. Curve 204 shows a target level of amplitude of 36 dBm over the range of frequencies from 1 MHz to 1 GHz and 4 Watts power. Curve 206 shows, for load capacitor with a value of 10 nF, amplitude at 36 dBm over the range of frequencies from 1 MHz to 1 GHz except a small dip in amplitude to 35.5 dBm between 1.8 and 2 MHz, and a larger dip in amplitude to 31 dBm between 500 and 800 MHz. Curve 208 shows, for a slew rate capacitor with a value of 4.7 nF, a level of amplitude of 36 dBm over the range of frequencies from 1 MHz to 1 GHz, except a large dip in amplitude to 32 dBm between 1.5 and 4.2 MHz. Curve 210 shows, for a slew rate capacitor with a value of 2.2 nF, a level of amplitude of 36 dBm over the range of frequencies from 1 MHz to 1 GHz, except a large dip in amplitude to 30 dBm between 1.5 and 9 MHz.

Figure 3:
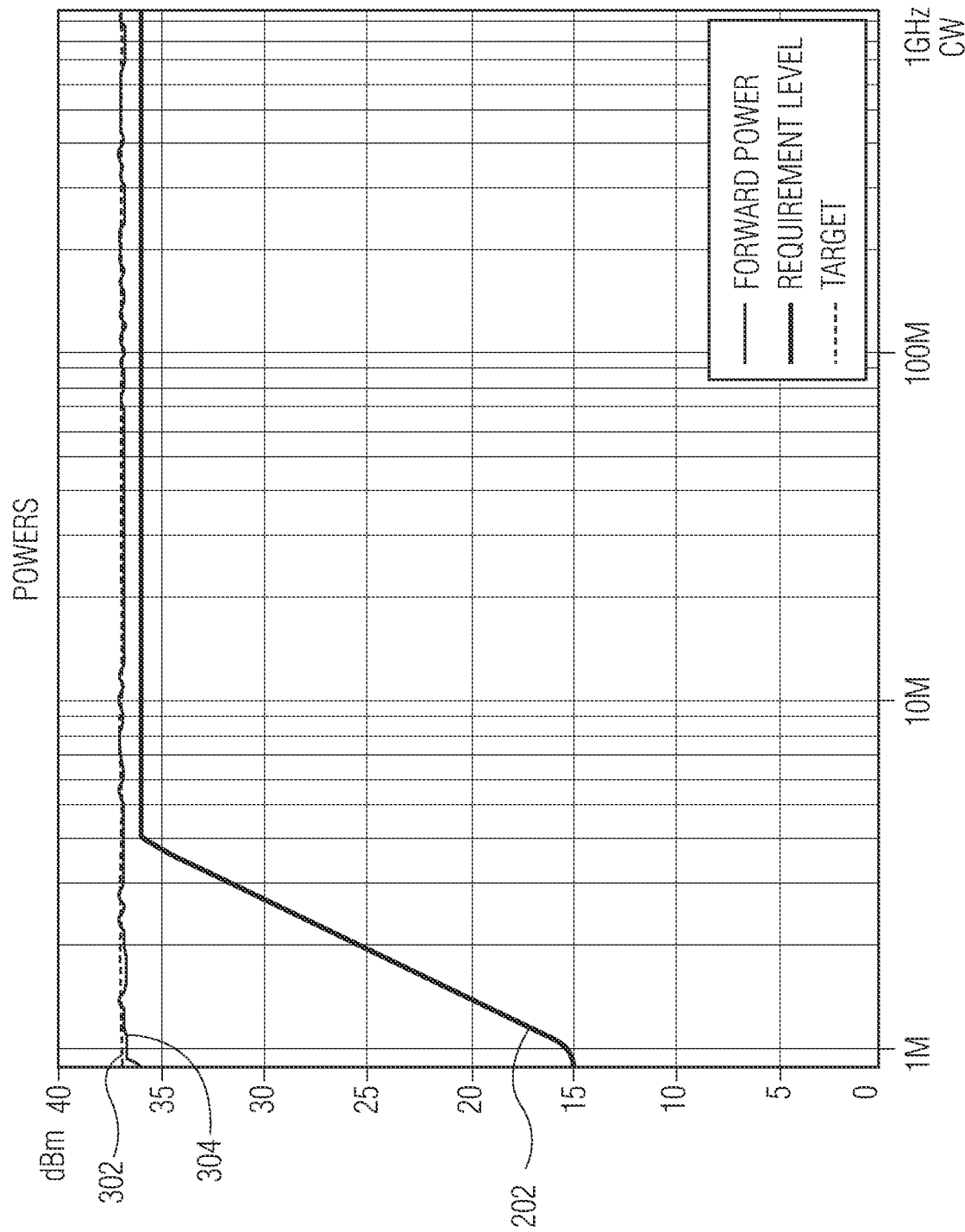
FIG. 3 illustrates a set of curves of an example of performance of multi-purpose output circuitry with design improvements disclosed herein.

As can be seen from FIG. 2, larger capacitance values for load capacitor 112 achieve better performance than lower capacitance values up to frequencies between 600 and 800 MHz. Smaller capacitance values for load capacitor 112 achieve better performance than higher capacitance values below 9 MHz. Thus, these two problem areas are addressed with medium cutoff frequency low pass filter 118 and high cutoff frequency low pass filter 105 in MPO circuit 102 (FIG. 1), as shown in FIG. 3, which illustrates a set of curves of an example of performance of multi-purpose output circuitry 102 with design improvements disclosed herein. The requirement curve 202 is the same as shown in FIG. 2, beginning with a ramp starting at 1 MHz with a 15 dBm amplitude and ending at 3 MHz at an amplitude of 36 dBm. At 3 MHz, requirement curve 202 remains at an amplitude of 36 dBm to a frequency of 1 GHz. Curve 302 shows a target level of amplitude of 36 dBm over the range of frequencies from 1 MHz to 1 GHz. Curve 304 shows, for a load capacitor with a value of 4.7 nF, amplitude at 36 dBm over the range of frequencies from 1 MHz to 1 GHz with no dips in amplitude at the lower or higher frequencies. Thus, medium cutoff frequency low pass filter 118 and high cutoff frequency low pass filter 105 remove the noise in the DPI perturbation that could otherwise cause power switch 124 to be turned ON when MPO circuit 102 is supposed to be OFF.

Figure 4:
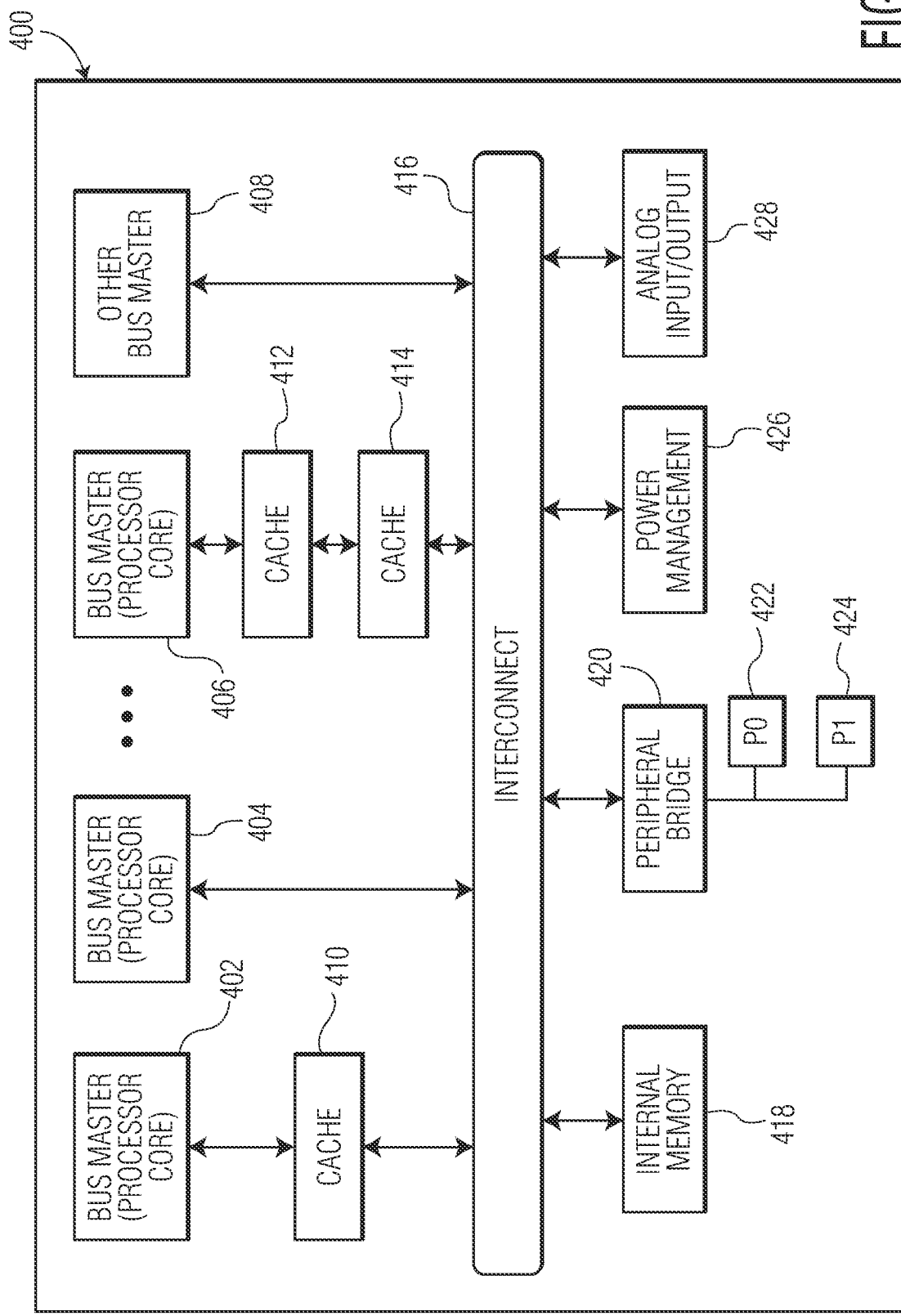
FIG. 4 illustrates an embodiment of a processing system in which the multipurpose output circuitry of FIG. 1 can be used, in accordance with the present invention.

FIG. 4 illustrates a simplified block diagram of components of processing system (which can also be referred to as an integrated circuit) 400 in which multi-purpose output circuit 102 with improved electromagnetic immunity in accordance with selected embodiments of the present invention can be included. Processing system 400 can include one or more bus masters in the form of processor cores 402, 404, 406, other bus masters 408 such as direct memory access controllers, one or more levels of cache memory 410, 412, 414 associated with one or more of the processor cores 402, 404, 406, interconnect 416, internal memory device 418, peripheral bridge 420 coupled to peripherals 422, 424, power management circuit 426, analog I/O circuitry 428, and other components such as network ports (not shown).

Analog I/O circuitry 428 can include various components such as power regulators, analog-to-digital converters, reference voltage circuits, input/output buffers and other circuits with electrostatic discharge protection, and fault detection circuit 430. Multipurpose output circuit 102 can be included in analog I/O 428. Other suitable components may be included in analog and input/output circuitry 428.

Processing cores 402, 404, 406 include computer processor circuitry capable of performing functions that may be implemented as software instructions, hardware circuitry, firmware, or a combination of software, hardware and/or firmware. Operations and functions may be performed under the control of an operating system. One or more instances of software application code may be executed at the same time. Application code being executed by processing cores 402, 404, 406 may access data and instructions in memory device 418 via interconnect 416. Processing cores 402, 404, 406 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. In addition or in the alternative, processing cores 402, 404, 406 may be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, or an embedded processor. Any other type of bus master logic 408, such as a direct memory access controller, capable of initiating or responding to requests, may also be included in processing system 400.

Processing system 400 can also include one or more network ports (not shown) configurable to connect to one or more networks, which may likewise accessible to one or more remote nodes. The remote nodes can include other applications processors, devices or sensors that can exchange information with processing system 400.

Interconnect 416 routes requests and responses between bus masters 402, 404, 406, 408 and power management circuit 426, peripheral bridge 420, one or more internal memory devices 418, and analog I/O circuitry 428.

Peripheral bridge 420 is communicatively coupled to interconnect 416. Peripheral bridge 420 can include, for example, circuitry to perform power management, flash management, interconnect management, USB, and other PHY type tasks. A variety of peripheral devices 422, 424 such as sensors, field programmable gate arrays, external integrated circuits, a mouse, keyboard, printer, display monitor, external memory drives, cameras, and lights, among others, can be coupled to processing system 400 via peripheral bridge 420.

Cache memory devices 410-414 are typically implemented using random-access memory (RAM) and can be used to hold instructions and data that are frequently accessed by a corresponding bus master 402-408. Information that is no longer used or less frequently used may be swapped out for information that has become more frequently accessed. Cache memory devices 410-414 can have different levels from each other. For example, cache memory devices 410 and 412 can be level one cache, and cache memory device 414 can be a level two cache. Other levels of cache memory can be included. Level one cache is typically faster and smaller in size than level two or three cache.

Internal memory device 418 may include one or more volatile storage (or memory) devices such as random-access memory (RAM), dynamic RAM (DRAM), synchronous DRAM (SDRAM), static RAM (SRAM), or other types of volatile storage devices. In addition or in the alternative, internal memory device 418 may include non-volatile memory, such as read only memory (ROM), electrically erasable programmable ROM, flash memory, magnetic RAM, resistive RAM, write once memory such as fuses, or the like. Additionally, tightly coupled memory may be connected directly to bus masters 402-408 with no connection to interconnect 416, or be connected between a respective one of bus masters 402-408 and interconnect 416, similar to cache memory devices 410-414. In whatever form, internal memory device 418 may store information including sequences of instructions that are executed by the processing device or any other device, information to configure processing system 400, and other data, instructions or information. For example, executable code and/or data, including but not limited to an operating system, device drivers, firmware (e.g., input output basic system or BIOS), and/or applications can be loaded in the memory and executed by processor cores 402, 404, 406.

Power management circuit 426 can include a processor core and can send and receive signals to control various operating power modes for bus masters 402-408, cache memory 410-414, internal memory 418, analog input/output (I/O) circuitry 428, and peripheral components 422, 424 through peripheral bridge 420. The power modes may include normal operation, sleep, or other power saving modes, and power down, as well as to supply proper levels of voltage to various components in processing system 400.

By now it should be appreciated that there has been provided an MPO circuit 102 that solves several different problem behaviors with solutions that address frequency dependencies. Two resistors 110, 114 are used in both directions to rebalance AC currents between high impedance at the input of driver circuit 120 and low impedance at the output of current sources 104. Appropriate values for capacitors 106 and 116 can be used in medium cutoff frequency low pass filter 118 and high cutoff frequency low pass filter 105 with different cut off frequencies to filter high frequency noise for current sources 104 and medium frequency noise for the input to driver circuit 120. Additionally, a strong pull-down device 122 can be used in driver circuit 120 to maintain the voltage at the control electrode of power switch 124 at 0V when MPO circuit 102 is to remain OFF. Further, body diode effects of power switch 124 act as a capacitor to help prevent power switch 124 from turning ON unintentionally due to DPI perturbation at high frequency above high cutoff frequency filter 110. Note also that MPO circuit 102 requires only one power switch 124 and one driver circuit 120, thereby allowing the size of MPO circuit 102 to be reduced compared to MPO circuits that require two power devices and two driver circuits.

In some embodiments, an integrated circuit can comprise an output terminal, (132), a power transistor (124) having a first current electrode coupled to the output terminal and a second current electrode coupled to a power supply terminal (e.g. GND), a driver having an output coupled to a control electrode of the power switch, a capacitor (CSR) having a first terminal coupled to the output terminal and a second terminal coupled to a circuit node, a first low pass filter (113) coupled between the circuit node and an input of the driver, the first low pass filter having a first cut off frequency, a set of current sources, and a second low pass filter (105) coupled between the circuit node and an output of the set of current sources, the second low pass filter having a second cut off frequency, higher than the first cut off frequency.

In another aspect, the first low pass filter can be characterized as a resistor-capacitor (RC) filter and includes a resistor coupled between the circuit node and an input of the driver.

In another aspect, the second low pass filter can be characterized as an RC filter and includes a resistor coupled between the output of the set of current sources and the circuit node.

In another aspect, the second low pass filter can be characterized as an RC filter and includes a resistor coupled between the output of the set of current sources and the circuit node.

In another aspect, the first cut off frequency can be at most 100 MHz.

In another aspect, the second cut off frequency can be at least 700 MHz.

In another aspect, the power supply terminal can be ground, wherein the driver comprises a pull-down device coupled between the control terminal of the power transistor and ground, such that when the power switch is off and the output terminal is at a battery voltage, the control terminal of the power transistor remains pulled towards ground.

In another aspect, the first low pass filter can prevent perturbations on the output terminal from reaching the driver over a first frequency range, and the second low pass filter can prevent perturbations on the output terminal from reaching the set of current sources over a second frequency range, wherein the first and second frequency ranges are different.

In another aspect, the power transistor can comprise an n-type metal-oxide-semiconductor (NMOS) transistor.

In other embodiments, an integrated circuit can comprise an output terminal (132), a power switch (124) having a first current electrode coupled to the output terminal and a second current electrode coupled to a power supply terminal (e.g. GND), a driver having an output coupled to a control electrode of the power switch, a capacitor (CSR) having a first terminal coupled to the output terminal and a second terminal coupled to a circuit node, a filter (118) coupled between the circuit node and an input of the driver, and a set of current sources having an output coupled to the circuit node.

In another aspect, the filter can be characterized as a resistor-capacitor (RC) filter and includes a resistor coupled between the circuit node and an input of the driver, and a capacitor coupled between the input of the driver and the power supply terminal.

In another aspect, a cut off frequency of the filter can be at most 100 MHz.

In another aspect, over a predetermined frequency range, the filter can deviate perturbations from the output terminal through the circuit node away from the input of the driver and towards the set of current sources.

In another aspect, the integrated circuit can further comprise a second filter (105) coupled between the output of the set of current sources and the circuit node which, over a second predetermined frequency range, non-overlapping with the first predetermined frequency range, can deviate perturbations from the output terminal through the circuit node away from the set of current sources and towards the driver.

In another aspect, the power switch can comprise an NMOS transistor.

In further embodiments, an integrated circuit can comprise an output terminal (132), a power switch (124) having a first current electrode coupled to the output terminal and a second current electrode coupled to a power supply terminal (e.g. GND), a capacitor (CSR) having a first terminal coupled to the output terminal and a second terminal coupled to a circuit node, a driver having an input coupled to the circuit node and an output coupled to a control electrode of the power switch, a set of current sources, and a filter (105) coupled between an output of the set of current sources and the circuit node.

In another aspect, the filter can be characterized as a resistor-capacitor (RC) filter and include a resistor coupled between the output of the set of current sources and the circuit node, and a capacitor coupled between the output of the set of current sources and the power supply terminal.

In another aspect, a cut off frequency of the filter can be at least 700 MHz.

In another aspect, over a predetermined frequency range, the filter can deviate perturbations from the output terminal through the circuit node away from the set of current sources towards the driver.

In another aspect, the power switch can comprise an NMOS transistor.

An integrated circuit can comprise an output terminal, a power transistor having a first current electrode coupled to the output terminal and a second current electrode coupled to a power supply terminal, a driver having an output coupled to a control electrode of the power switch, a capacitor having a first terminal coupled to the output terminal and a second terminal coupled to a circuit node, a first low pass filter coupled between the circuit node and an input of the driver, the first low pass filter having a first cut off frequency, a set of current sources, and a second low pass filter coupled between the circuit node and an output of the set of current sources. The second low pass filter can have a second cut off frequency that is higher than the first cut off frequency.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Semiconductor and other types of electronic devices are often encapsulated wholly or partly in plastic resin to provide environmental protection and facilitate external connection to the devices. For convenience of explanation and not intended to be limiting, the present invention is described for semiconductor devices, but persons of skill in the art will understand that the present invention applies to any type of electronic device that is substantially in chip form. Accordingly, such other types of devices including the non-limiting examples given below, are intended to be included in the terms "device", "electronic device", "semiconductor device" and "integrated circuit" whether singular or plural, and the terms "device", "die" and "chip" are intended to be substantially equivalent. Non-limiting examples of suitable devices are semiconductor integrated circuits, individual semiconductor devices, piezoelectric devices, magnetostrictive devices, solid state filters, magnetic tunneling structures, integrated passive devices such as capacitors, resistors and inductors, and combinations and arrays of any and all of these types of devices and elements. Further, the present invention does not depend upon the types of die or chips being used nor the materials of which they are constructed provided that such materials withstand the encapsulation process.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

The invention claimed is:

1. An integrated circuit, comprising:
   an output terminal;
   a power transistor having a first current electrode coupled to the output terminal and a second current electrode coupled to a power supply terminal;
   a driver having an output coupled to a control electrode of the power switch;
   a capacitor having a first terminal coupled to the output terminal and a second terminal coupled to a circuit node;
   a first low pass filter coupled between the circuit node and an input of the driver, the first low pass filter having a first cut off frequency;
   a set of current sources; and
   a second low pass filter coupled between the circuit node and an output of the set of current sources, the second low pass filter having a second cut off frequency, higher than the first cut off frequency.

2. The integrated circuit of claim 1, wherein the first low pass filter is characterized as a resistor-capacitor (RC) filter and includes a resistor coupled between the circuit node and an input of the driver.

3. The integrated circuit of claim 2, wherein the second low pass filter is characterized as an RC filter and includes a resistor coupled between the output of the set of current sources and the circuit node.

4. The integrated circuit of claim 1, wherein the second low pass filter is characterized as an RC filter and includes a resistor coupled between the output of the set of current sources and the circuit node.

5. The integrated circuit of claim 1, wherein the first cut off frequency is at most 100 MHz.

6. The integrated circuit of claim 5, wherein the second cut off frequency is at least 700 MHz.

7. The integrated circuit of claim 1, wherein the power supply terminal is ground, wherein the driver comprises a pull-down device coupled between the control terminal of the power transistor and ground, such that when the power switch is off and the output terminal is at a battery voltage, the control terminal of the power transistor remains pulled towards ground.

8. The integrated circuit of claim 1, wherein the first low pass filter prevents perturbations on the output terminal from reaching the driver over a first frequency range, and the second low pass filter prevents perturbations on the output terminal from reaching the set of current sources over a second frequency range, wherein the first and second frequency ranges are different.

9. The integrated circuit of claim 1, wherein the power transistor comprises an n-type metal-oxide-semiconductor (NMOS) transistor.

10. An integrated circuit, comprising:
    an output terminal;
    a power switch having a first current electrode coupled to the output terminal and a second current electrode coupled to a power supply terminal;
    a driver having an output coupled to a control electrode of the power switch;
    a capacitor having a first terminal coupled to the output terminal and a second terminal coupled to a circuit node;

a first filter coupled between the circuit node and an input of the driver;

a set of current sources having an output coupled to the circuit node, wherein the first filter is configured to deviate perturbations from the output terminal through the circuit node away from the input of the driver and towards the set of current sources over a first predetermined frequency range; and a second filter coupled between the output of the set of current sources and the circuit node, wherein the second filter is configured to deviate perturbations from the output terminal through the circuit node away from the set of current sources and towards the driver over a second predetermined frequency range, non-overlapping with the first predetermined frequency range.

11. The integrated circuit of claim 10, wherein the first filter is characterized as a resistor-capacitor (RC) filter and includes a resistor coupled between the circuit node and an input of the driver, and a capacitor coupled between the input of the driver and the power supply terminal.

12. The integrated circuit of claim 10, wherein a cut off frequency of the first filter is at most 100 MHz.

13. The integrated circuit of claim 10, wherein the power switch comprises an NMOS transistor.

* * * * *